(12) United States Patent
Takashita et al.

(10) Patent No.: US 9,204,530 B2
(45) Date of Patent: Dec. 1, 2015

(54) ELECTRONIC COMPONENTS ASSEMBLY

(71) Applicant: PANASONIC CORPORATION, Osaka (JP)

(72) Inventors: Hiromitsu Takashita, Osaka (JP); Tsuyoshi Takeda, Osaka (JP); Yuko Konno, Tokyo (JP); Hiroaki Fujiwara, Nara (JP); Shingo Yoshioka, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 73 days.

(21) Appl. No.: 13/869,553

(22) Filed: Apr. 24, 2013

(65) Prior Publication Data
US 2013/0265729 A1 Oct. 10, 2013

Related U.S. Application Data

(63) Continuation-in-part of application No. PCT/JP2011/005895, filed on Oct. 20, 2011.

(30) Foreign Application Priority Data

Oct. 25, 2010 (JP) .................................. 2010-238942

(51) Int. Cl.
*H05K 7/00* (2006.01)
*H05K 1/02* (2006.01)
(Continued)

(52) U.S. Cl.
CPC ............ *H05K 1/0213* (2013.01); *H01L 21/563* (2013.01); *H01L 23/49811* (2013.01);
(Continued)

(58) Field of Classification Search
CPC ................. H01L 2924/014; H01L 2224/0401; H01L 2224/04026; H01L 2224/05548; H01L 2224/05564; H01L 2224/05568; H01L 2224/05572; H01L 2224/16104; H01L 2224/16105; H01L 2224/16112; H01L 2224/16113; H01L 2224/16147
USPC .......... 174/259, 260, 261; 361/760, 768, 767, 361/777; 257/781, 750, 779, 737, 778
See application file for complete search history.

(56) References Cited

U.S. PATENT DOCUMENTS 5,629,835 A * 5/1997 Mahulikar et al. ............ 361/719
6,143,991 A * 11/2000 Moriyama .................... 174/261
(Continued)

FOREIGN PATENT DOCUMENTS

CN 1246202 A 3/2000
JP 08-298272 11/1996
(Continued)

OTHER PUBLICATIONS

Taiwanese Office Action issued in Taiwanese Application No. 100138485 dated Mar. 11, 2014, w/Partial English translation.
(Continued)

*Primary Examiner* — Yuriy Semenenko
(74) *Attorney, Agent, or Firm* — McDermott Will & Emery LLP

(57) ABSTRACT

The present invention relates to electronic components assembly for electrically connecting electronic components to each other, wherein a wiring formed on a surface of a first electronic component and a wiring formed on a surface of a second electronic component face each other, and are bonded to each other with an electric conductor interposed therebetween, so as to electrically connect the first electronic component and the second electronic component. The electric conductor is a resin composition containing solder or conductive filler.

7 Claims, 17 Drawing Sheets

(51) Int. Cl.
  *H01L 23/498* (2006.01)
  *H01L 21/56* (2006.01)
  *H05K 3/36* (2006.01)
  *H01L 25/065* (2006.01)
  *H01L 23/00* (2006.01)
  *H01L 23/66* (2006.01)
  *H01L 25/10* (2006.01)
  *H05K 1/11* (2006.01)
  *H05K 3/32* (2006.01)
  *H05K 3/40* (2006.01)

(52) U.S. Cl.
  CPC ............. *H01L24/05* (2013.01); *H01L 24/16* (2013.01); *H01L 24/32* (2013.01); *H05K 3/368* (2013.01); *H01L 23/66* (2013.01); *H01L 24/13* (2013.01); *H01L 24/27* (2013.01); *H01L 24/29* (2013.01); *H01L 24/81* (2013.01); *H01L 24/83* (2013.01); *H01L 25/0657* (2013.01); *H01L 25/105* (2013.01); *H01L 2223/6605* (2013.01); *H01L 2224/0235* (2013.01); *H01L 2224/0237* (2013.01); *H01L 2224/02311* (2013.01); *H01L 2224/02375* (2013.01); *H01L 2224/02379* (2013.01); *H01L 2224/02381* (2013.01); *H01L 2224/0401* (2013.01); *H01L 2224/04026* (2013.01); *H01L 2224/05548* (2013.01); *H01L 2224/05553* (2013.01); *H01L 2224/05564* (2013.01); *H01L 2224/05568* (2013.01); *H01L 2224/05572* (2013.01); *H01L 2224/131* (2013.01); *H01L 2224/16104* (2013.01); *H01L 2224/16105* (2013.01); *H01L 2224/16112* (2013.01); *H01L 2224/16113* (2013.01); *H01L 2224/16147* (2013.01); *H01L 2224/16148* (2013.01); *H01L 2224/16225* (2013.01); *H01L 2224/16227* (2013.01); *H01L 2224/16237* (2013.01); *H01L 2224/16238* (2013.01); *H01L 2224/2741* (2013.01); *H01L 2224/27436* (2013.01); *H01L 2224/291* (2013.01); *H01L 2224/293* (2013.01); *H01L 2224/2929* (2013.01); *H01L 2224/32104* (2013.01); *H01L 2224/32105* (2013.01); *H01L 2224/32147* (2013.01); *H01L 2224/32148* (2013.01); *H01L 2224/32227* (2013.01); *H01L 2224/32237* (2013.01); *H01L 2224/32238* (2013.01); *H01L 2224/81801* (2013.01); *H01L 2224/83191* (2013.01); *H01L 2224/83192* (2013.01); *H01L 2224/83203* (2013.01); *H01L 2224/83801* (2013.01); *H01L 2224/83851* (2013.01); *H01L 2225/06513* (2013.01); *H01L 2924/00014* (2013.01); *H01L 2924/10157* (2013.01); *H01L 2924/30111* (2013.01); *H01L 2924/381* (2013.01); *H01L 2924/3841* (2013.01); *H05K 1/112* (2013.01); *H05K 1/114* (2013.01); *H05K 3/323* (2013.01); *H05K 3/4007* (2013.01); *H05K 2201/0367* (2013.01); *H05K 2201/09045* (2013.01); *H05K 2201/09227* (2013.01); *H05K 2201/09245* (2013.01); *H05K 2201/09263* (2013.01); *H05K 2201/09381* (2013.01); *H05K 2201/09427* (2013.01)

(56) References Cited

U.S. PATENT DOCUMENTS

| | | | |
|---|---|---|---|
| 7,247,800 B2* | 7/2007 | Takahashi | 174/255 |
| 8,378,485 B2* | 2/2013 | Bachman et al. | 257/737 |
| 8,580,621 B2* | 11/2013 | Bachman et al. | 438/121 |
| 8,693,210 B2* | 4/2014 | Stone | 361/771 |
| 2002/0001873 A1* | 1/2002 | Kang | 438/106 |
| 2004/0130012 A1 | 7/2004 | Hedler | |
| 2005/0110164 A1* | 5/2005 | Pendse | 257/778 |
| 2007/0290306 A1 | 12/2007 | Muramatsu et al. | |
| 2009/0309679 A1 | 12/2009 | Kikuchi et al. | |
| 2010/0164097 A1 | 7/2010 | Pendse | |
| 2012/0182083 A1 | 7/2012 | Kikuchi et al. | |

FOREIGN PATENT DOCUMENTS

| | | |
|---|---|---|
| JP | 08-321671 | 12/1996 |
| JP | 2000-150575 A | 5/2000 |
| JP | 2000-183231 A | 6/2000 |
| JP | 2005-136402 A | 5/2005 |
| JP | 2008-294318 A | 12/2008 |
| JP | 2009111043 A | 5/2009 |
| JP | 2010-021505 A | 1/2010 |
| JP | 2010-056202 A | 3/2010 |
| JP | 05-095210 B2 | 12/2012 |
| TW | 200803673 A | 1/2008 |
| TW | 200935531 A | 8/2009 |

OTHER PUBLICATIONS

International Search Report mailed Jan. 10, 2012 issued in corresponding International Application No. PCT/JP2011/005895.
Chinese Office Action and Search Report issued in Chinese Application No. 201180051390.X dated Mar. 3, 2015, with English Translation of Search Report.

* cited by examiner

ELECTRONIC COMPONENTS ASSEMBLY

TECHNICAL FIELD

The present invention relates to a bonding configuration (an assembly) of electronic components, and more particularly to an improvement of electric connection between electronic components.

BACKGROUND ART

To fabricate a package where a semiconductor chip is mounted onto a substrate, for example, the connection pad of the semiconductor chip and the connection pad of the substrate are bonded and electrically connected via bumps. Also to mount a package onto a circuit board, for example, a land of the package and a land of the circuit board are bonded and electrically connected via bumps. In both cases, a possible problem is an impedance mismatch due to reflection loss or the like in the connection portions, and impedance drops because of the difference of sizes between the wiring routed to the pad and the land, and the pad, land or bump. This problem is particularly conspicuous in a high-speed signal transmission area, such as the GHz band.

Patent Document 1 discloses that a bonding portion wiring formed on a substrate and a chip bonding portion of a semiconductor chip face each other and are bonded to each other, whereby the substrate and the semiconductor chip are electrically connected. The size of the bonding portion wiring and the size of the bonding portion of the chip, according to Patent Document 1, are different from each other.

Patent Document 2 discloses that a wiring on the top surface of the circuit board and a wiring on the top surface of a surface mount device are connected via the inclined plane of the surface mount device, whereby the surface mount device is mounted on the circuit board. Both the wiring of the circuit board and the wiring of the surface mount device, according to Patent Document 2, face up, and the end portions of each wiring are butt-connected to each other.

Patent Document 1: Japanese Patent Application No. 2000-183231A (paragraph 0053, FIG. 1)

Patent Document 2: Japanese Patent Application No. 2010-21505A (paragraphs 0021 to 0022, FIG. 4)

SUMMARY OF THE INVENTION

It is an object of the present invention to decrease mismatch of impedance in the connection portion by a non-conventional configuration when electronic components are electrically connected to each other, and to permit the connection with narrow pitch without causing solder bridge etc.

In the present invention, an electronic component is a component that can be electrically connected with another electronic component, including a semiconductor chip, a substrate, a package and a circuit board. Electronic components that are electrically connected to each other are, for example, a semiconductor chip and a semiconductor chip, a semiconductor chip and a substrate, a package and a package, a package and a circuit board, and a circuit board and a circuit board. Various combinations of these components are also included in this definition of electronic components.

An aspect of the present invention is an assembly of electronic components in which electronic components are electrically connected to each other, wherein a wiring formed on a surface of a first electronic component and a wiring formed on a surface of a second electronic component face each other, and are bonded to each other with an electric conductor interposed therebetween, so as to electrically connect the first electronic component and the second electronic component.

In this invention, it is preferable that the electric conductor is a resin composition containing solder or conductive filler.

In this invention, it is preferable that protrusions are formed on the surface of the first electronic component and/or the surface of the second electronic component, a wiring is formed on a tip of the protrusion, and the wiring of the first electronic component and the wiring of the second electronic component are bonded to each other at the tip of the protrusion.

In this invention, it is preferable that the protrusions are: protrusions formed by molding the surface of the first electronic component or the surface of the second electronic component into convex forms; protrusions formed by coating supports included in the first electronic component or the second electronic component coated with an insulator; protrusions formed by coating convex forms on the surface of the first electronic component or the surface of the second electronic component with an insulator; and/or protrusions that are convex forms formed of an insulator on the surface of the first electronic component or the surface of the second electronic component.

In this invention, it is preferable that the wiring of the first electronic component and/or the wiring of the second electronic component are/is partially or totally buried into the surface of the first electronic component and/or the second electronic component.

Another aspect of the present invention is a method of connecting electronic components for electrically connecting electronic components to each other, wherein a wiring formed on a surface of a first electronic component and a wiring formed on a surface of a second electronic component face each other, and are bonded to each other with an electric conductor interposed therebetween, so as to electrically connect the first electronic component and the second electronic component.

According to the present invention, wirings are bonded without a pad or a land interposed therebetween when electronic components are electrically connected to each other, therefore mismatch of impedance in the connecting portion can be decreased. In addition, the present invention permit the connection with narrow pitch using less solder amount without causing solder bridges etc.

DESCRIPTION OF EMBODIMENTS

Figure 1:
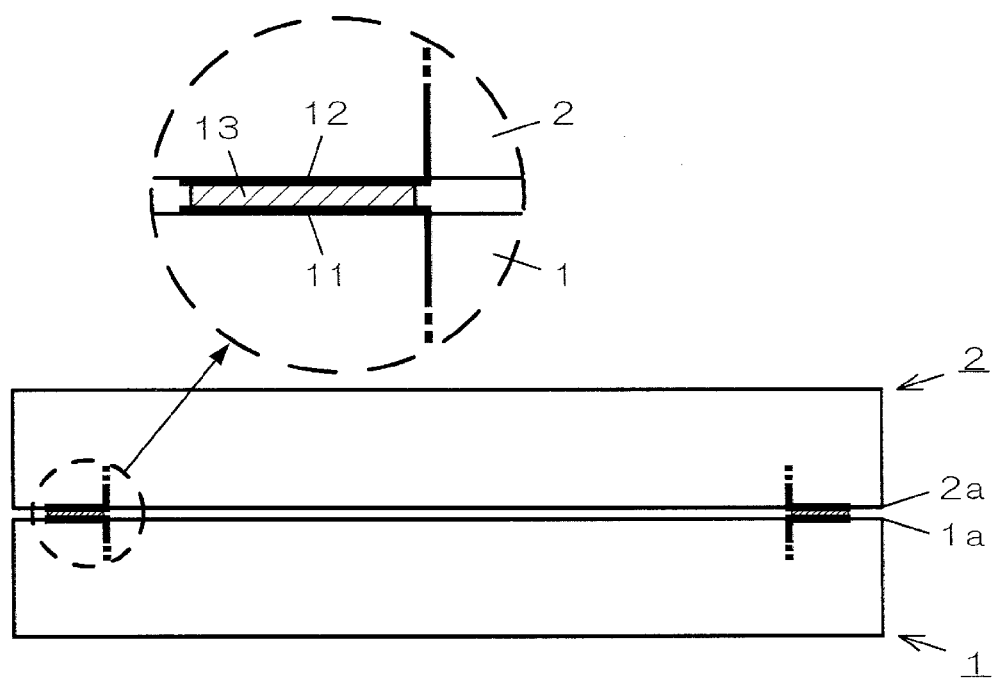
FIG. 1 is a side view depicting a bonding configuration of electronic components according to Embodiment 1.

In each of the following embodiments, a first electronic component and a second electronic component are, for example, a semiconductor chip and a semiconductor chip, a semiconductor chip and a substrate, a package and a package, a package and a circuit board, or a circuit board and a circuit board. Various combinations of these components are also included in the present embodiment.

Embodiment 1

According to an assembly of electronic components of the present invention, the electronic components are electrically connected to each other by bonding wirings to each other without a pad or a land interposed therebetween, therefore mismatch of impedance in the connection portion can be decreased. In this embodiment, "assembly of electronic components" refers to a bonded body of two or more electronic components which are electrically connected as shown in the drawings to be described later.

Embodiment 1 of the present invention will now be described in concrete terms with reference to FIG. 1 and FIG. 2. In the drawings, the reference numeral 1 denotes a first electronic component, the reference numeral 2 denotes a second electronic component, the reference numeral 1a denotes a surface of the first electronic component, the reference numeral 2a denotes a surface of the second electronic component, the reference numeral 11 denotes a wiring of the first electronic component, the reference numeral 12 denotes a wiring of the second electronic component, and the reference numeral 13 is solder used as an electric conductor.

As shown in FIG. 1, the wiring 11 is formed on the surface 1a of the first electronic component 1, the wiring 12 is formed on the surface 2a of the second electronic component 2, the wiring 11 of the first electronic component and the wiring 12 of the second electronic component face each other, and are bonded to each other with solder 13 as an electric conductor interposed therebetween so as to electrically connect the first electronic component 1 and the second electronic component 2. The wirings 11 and 12 are drawn from inside the first and second electronic components 1 and 2, and are exposed to the surfaces 1a and 1b.

Figure 2A:
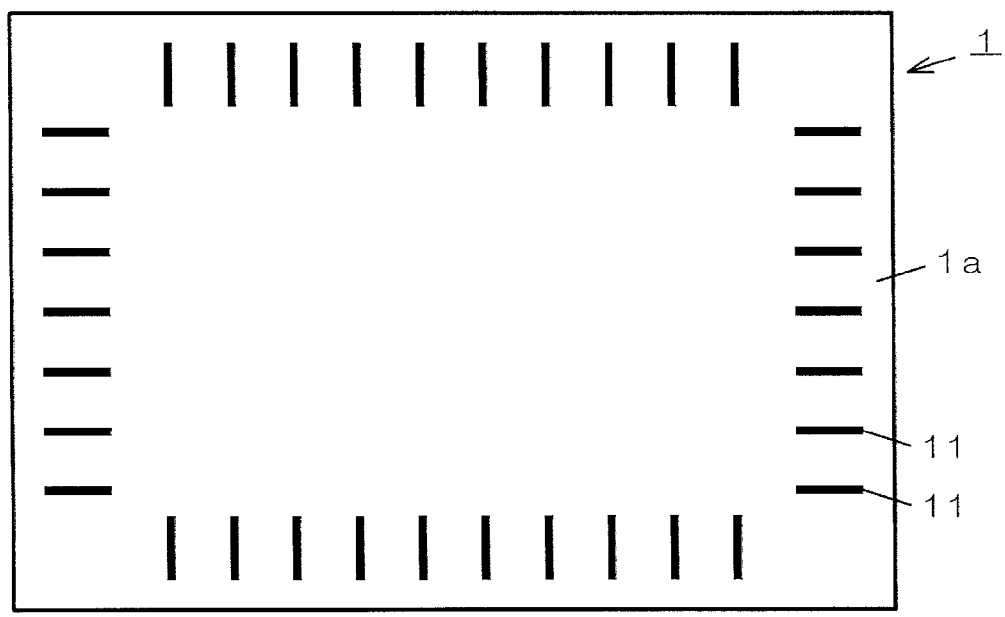
FIG. 2A is a plan view depicting a surface of a first electronic component according to Embodiment 1.
Figure 2B:
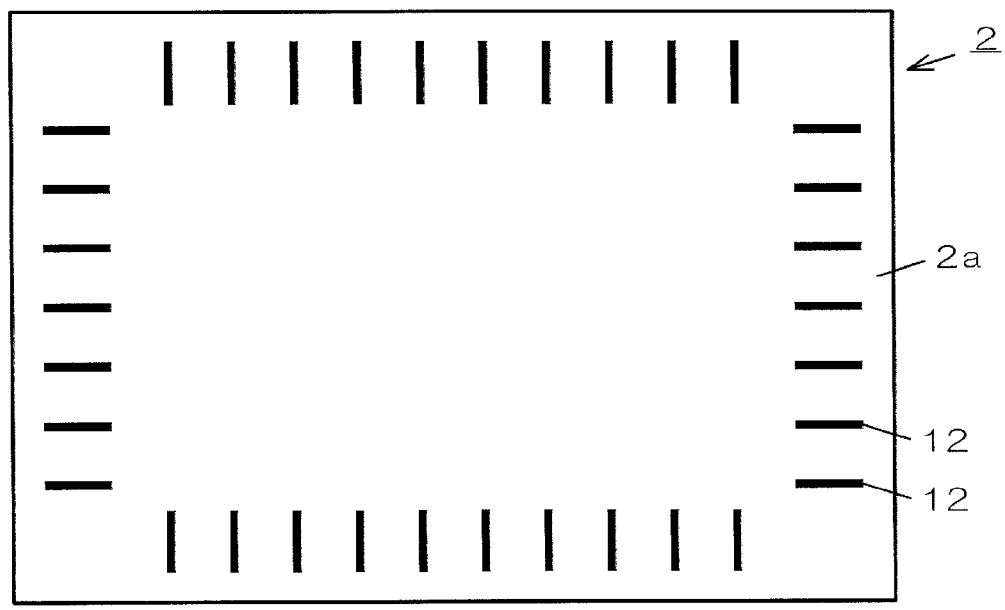
FIG. 2B is a plan view depicting a surface of a second electronic component according to Embodiment 1.

As shown in FIG. 2A, a plurality of wirings 11 are formed on the surface 1a of the first electronic component 1. As shown in FIG. 2B, a plurality of wirings 12 are formed on the surface 2a of the second electronic component 2 in positions corresponding to the wirings 11 of the first electronic component. The wirings 11 and 12 corresponding to each other are overlayed and bonded. The width of the wiring 11 or 12 is 80 µm or less, for example, preferably 40 µm or less, or more preferable 20 µm or less.

The width of the wiring need not be uniform, but a part of the wiring may be wider. In this case, it is preferable that the increased wiring width is 150% or less, preferably 130% or less, and more preferable 120% or less compared with the range of the wiring width mentioned above.

In this embodiment, solder 13 is used as an electric conductor. By this solder 13, the electrical connection and mechanical bonding of the first electronic component 1 and the second electronic component 2 are implemented. The solder 13 is approximately contained within the width of the wirings 11 and 12. "Approximately contained" means that if the width of the wirings 11 and 12 is 100%, the width of the solder 13 is 150% or less, preferably 130% or less, more preferably 120% or less, and ideally 100% or less.

The wiring 11 of the first electronic component and the wiring 12 of the second electronic component may extend in mutually the same direction and may be bonded for a relatively long distance, or may extend in mutually different directions and may be bonded for a relatively short distance. The wirings to be bonded may be bonded in a state where the wirings are partially misaligned, but preferably be bonded so that the contact area is not overly decreased, in order to prevent connection failure.

Embodiment 2

Embodiment 2 of the present invention will now be described with reference to FIG. 3 and FIG. 4. Only sections which are different from Embodiment 1 will be described. In the drawings, the reference numeral 14 denotes ACP (anisotropic conductive paste) or ACF (anisotropic conductive film) as an electric conductor, the reference numeral 14a denotes conductive filler, and the reference numeral 14b denotes resin composition.

Figure 3:
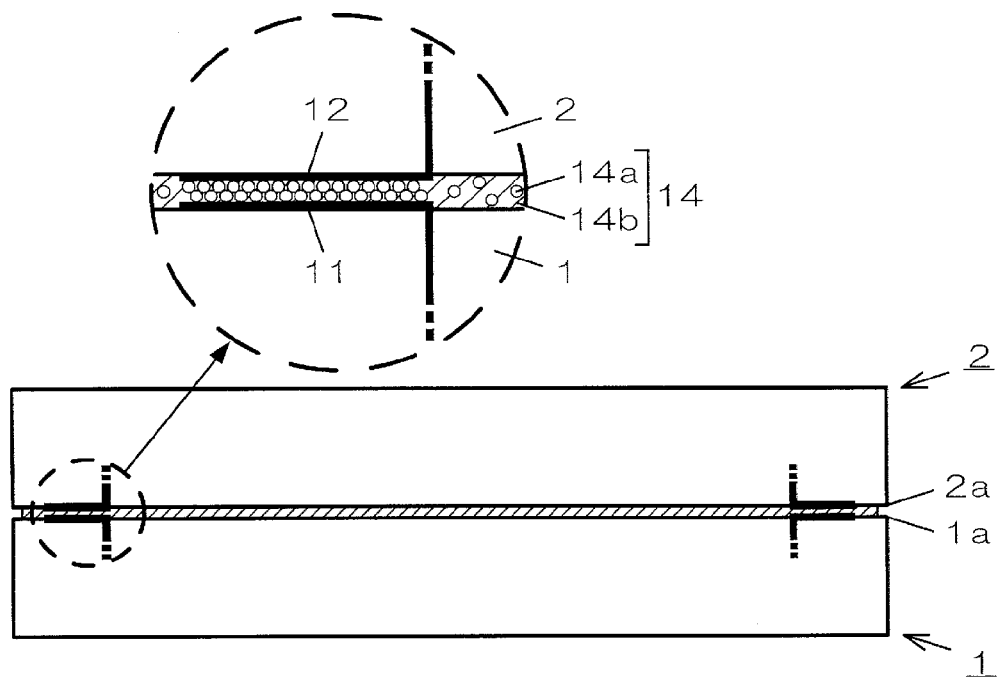
FIG. 3 is a side view depicting a bonding configuration of electronic components according to Embodiment 2.
Figure 4:
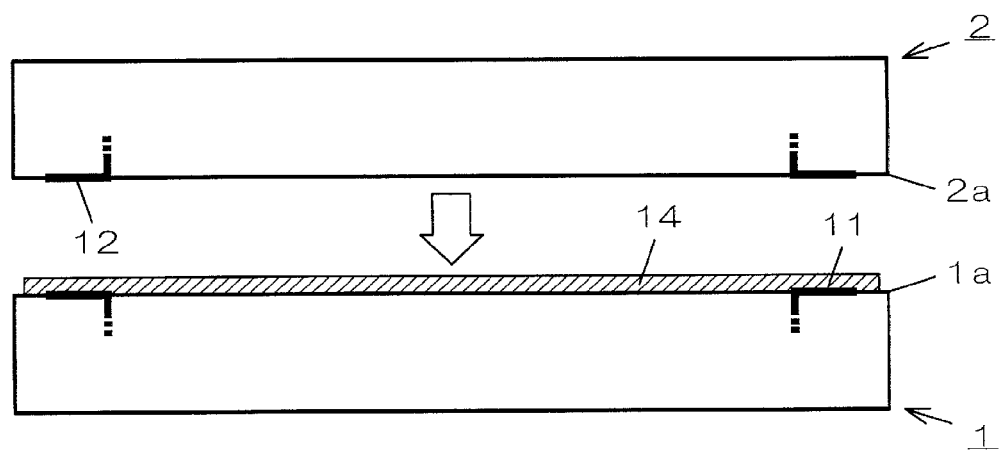
FIG. 4 is a diagram depicting a method for implementing the bonding configuration of the electronic components according to Embodiment 2.

As shown in FIG. 3, ACP 14 or ACF 14 is used as the electric conductor. In this embodiment, ACP 14 or ACF 14 is resin composition 14b containing conductive filler 14a. The ACP 14 or ACF 14 allows electrical connection and mechanical bonding between the first electronic component 1 and the second electronic component 2. The ACP 14 or ACF 14 is filled into a gap between the first and second electronic components 1 and 2. The ACP 14 or ACF 14 has anisotropic properties with respect to electrical conduction. In other words, only the wirings in the connection direction (superposition direction) are conducted with each other, and the insulation is maintained between adjacent wirings. The conductive filler 14a that functions as an electric conductor, out of the constituents of the ACP 14 or ACF 14, is inserted between the superposed wirings 11 and 12, and is approximately contained within the width of the wirings 11 and U.

The bonding configuration of the electronic components shown in FIG. 3 can be implemented as follows. As shown in FIG. 4, the ACP 14 or ACF 14 is coated or formed on the surface 1a of the first electronic component 1. Then the wiring 11 of the first electronic component is coated with the ACP 14 or ACF 14. The surface 1a of the first electronic component 1 and the surface 2a of the second electronic component 2 are positioned to face each other, and the wirings 11 of the first electronic component and the wirings 12 of the second electronic component are positioned to face each other. In this state, the first electronic component 1 and the second electronic component 2 are thermo-compressed. The ACP 14 or ACF 14 is filled into the gap between the first and second electronic components 1 and 2, but only the wirings 11 and 12 in the connecting direction (superposing direction) are conducted to each other, and only the superposed wirings 11 and 12 are bonded to each other.

Embodiment 3

Embodiment 3 of the present invention will now be described with reference to FIG. 5 to FIG. 9. Only sections which are different from Embodiments 1 and 2 will be described. In the drawings, the reference numeral 15 denotes a protrusion, the reference numeral 18 denotes an insulation base material, the reference numeral 19 denotes a resin film, and the reference numeral 20 denotes a wiring pattern groove.

Figure 5:
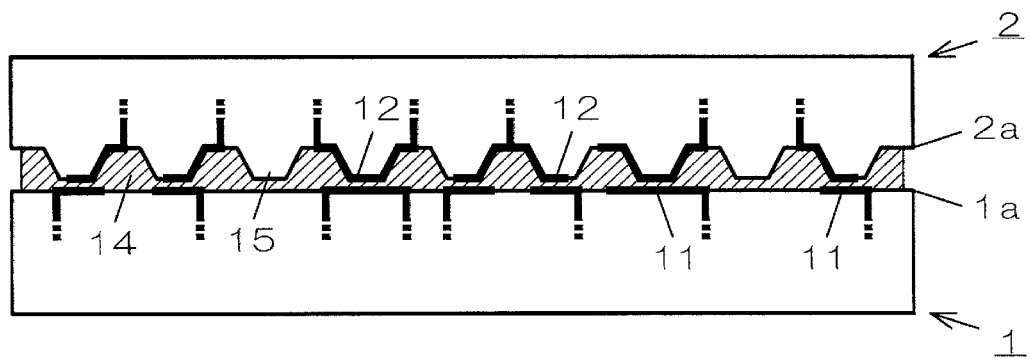
FIG. 5 is a side view depicting a bonding configuration of electronic components according to Embodiment 3.

As shown in FIG. 5, according to this embodiment, protrusions 15 are formed on the surface 2a of a second electronic component 2, wirings 12 are formed on the tips of the protrusions 15, and on the tips of the protrusions 15, wirings 11 of a first electronic component and the wirings 12 of the second electronic component are bonded by the ACP 14 or ACF 14.

According to this embodiment, the protrusions 15 are formed on the surface 2a of the second electronic component 2, which is molded to have convex forms. In this embodiment, the protrusion 15 has truncated cone shapes. The protrusion 15, however, is not limited to this, but may have a different shape, such as a truncated pyramid, a column, a prism or a semi-sphere.

Figure 6:
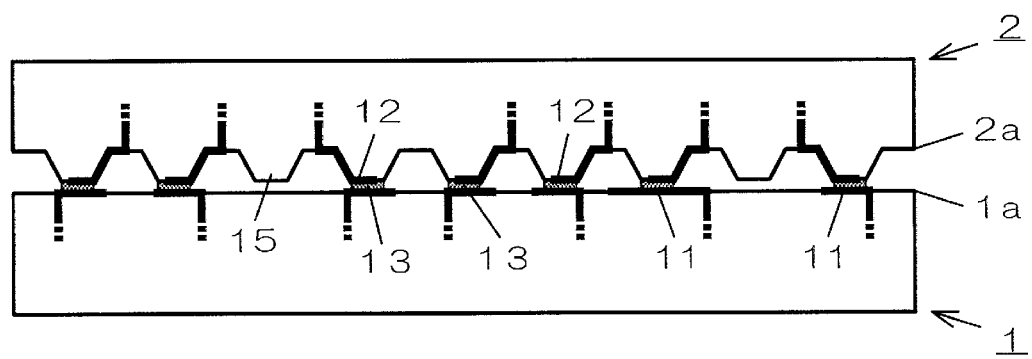
FIG. 6 is a side view depicting another bonding configuration of electronic components according to Embodiment 3.

As shown in FIG. 6, another bonding configuration according to this embodiment is that the wiring 11 of the first electronic component and the wiring 12 of the second electronic component are bonded with solder (electric conductor) 13. In this case, only the wiring portion on the protrusion 15 is bonded by solder 13, so the advantage is that connection is possible with a small amount of solder. Further, a solder bridge hardly occurs between adjacent solder pieces during soldering for a connection, and a short circuit does not occur very much either. Connection with a narrow pitch is also possible.

Figure 7:
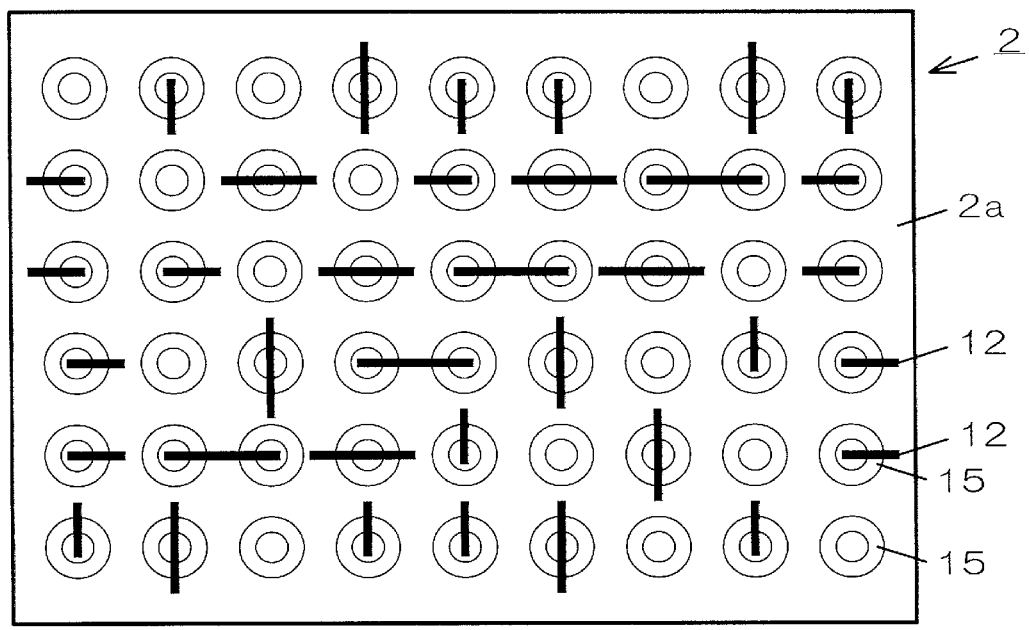
FIG. 7 is a plan view depicting a surface of a second electronic component according to Embodiment 3.

As shown in FIG. 7, a plurality of wirings 12 are formed on the surface 2a of the second electronic component 2. The wiring 12 passes through the tip of the protrusions 15. A plurality of wirings 11 are also formed on the surface 1a of the first electronic component 1 bonded to the second electronic component 2 as shown in FIG. 5 and FIG. 6 at positions corresponding to the wirings 12 on the second electronic component. The wirings 11 and 12 which correspond to each other are superposed and bonded to each other.

Figure 8:
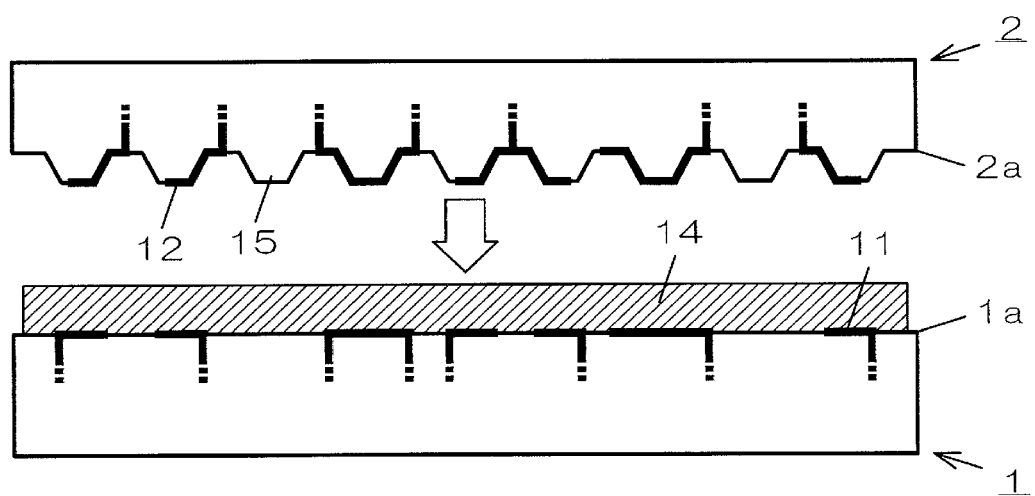
FIG. 8 is a diagram depicting a method for implementing the bonding configuration of the electronic components according to Embodiment 3.

The bonding configuration of the electronic components shown in FIG. 5 can be implemented as follows. As shown in FIG. 8, the ACP 14 or ACF 14 is coated or formed on the surface 1a of the first electronic component 1. Then the wiring 11 of the first electronic component is coated with the ACP 14 or ACF 14. The surface 1a of the first electronic component 1 and the surface 2a of the second electronic component 2 are positioned to face each other, and the wiring 11 of the first electronic component and the wiring 12 of the second electronic component are positioned to face each other. In this state, the first electronic component 1 and the second electronic component 2 are thermo-compressed. In this case, the tips of the protrusions 15 of the second electronic component 2 press against the surface 1a of the first electronic component 1. The ACP 14 or ACF 14 is filled into the gap between the first and second electronic components 1 and 2, but only the wirings 11 and 12 in the connecting direction (superposing direction) are conducted to each other, and only the superposed wirings 11 and 12 are bonded to each other.

The bonding configuration shown in FIG. 6 is implemented by placing the surface 1a of the first electronic component 1 and the surface 2a of the second electronic component 2 to face each other, positioning the wiring 11 of the first electronic component and the wiring 12 of the second electronic component to face each other, and bonding the wirings with solder 13 (electric conductor) interposed therebetween, just like Embodiment 1.

Figure 9A:
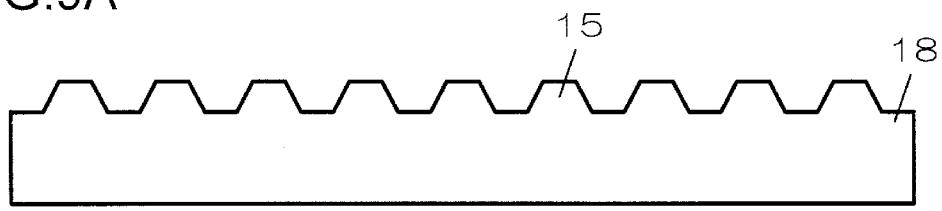
FIGS. 9A through 9D are diagrams depicting a method for acquiring the second electronic component according to Embodiment 3.

The second electronic component 2 can be acquired, for example, as follows. First, as shown in FIG. 9A, an insulation base material 18 of which surface is molded to have convex forms is prepared. The surface molded to have convex forms constitutes the protrusions 15.

Figure 9B:
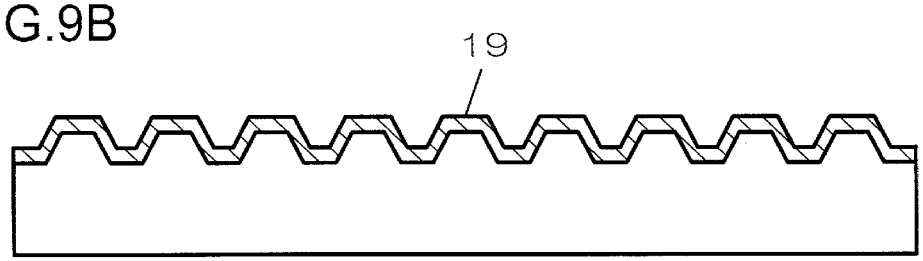

Then as shown in FIG. 9B, a resin film 19 is formed on the surface of the insulation base material 18. The surface of the resin film 19 has concave and convex portions corresponding to the insulation base material 18.

Figure 9C:
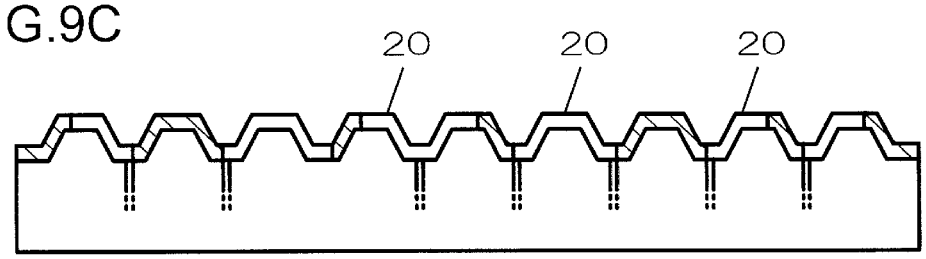

As shown in FIG. 9C, a wiring pattern groove 20 having a depth that is the same as or exceeding the thickness of the resin film 19 (in this example a wiring pattern groove having a depth that is the same as the thickness of the resin film 19) is formed from the surface side of the resin film 19. The wiring pattern groove 20 includes continuous holes that lead to the inside of the second electronic component 2. This wiring pattern groove 20 can be formed more accurately if laser processing is performed from the surface side of the resin film 19, for example.

Figure 9D:
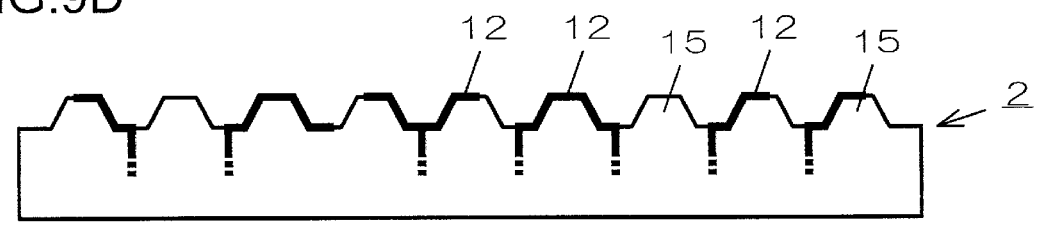

Then plating catalyst or a precursor thereof is coated on the surface of the wiring pattern groove 20. Then the resin film 19 is removed by dissolution or swelling. Then electroless plating is performed so that a plating film is formed only on the portion where the plating catalyst or the plating catalyst formed by the precursor of the plating catalyst remains. The plating film constitutes the wiring 12. Thereby as shown in FIG. 9D, the wiring 12 is formed exactly as the wiring pattern groove 20 on the surface 2a of the second electronic component 2.

In this embodiment, protrusions 15 are formed on the surface 2a of the second electronic component 2, and the wiring 12 is formed on the tips of the protrusions 15, but instead of or in addition to this, protrusions 15 may be formed on the surface 1a of the first electronic component 1, and the wiring 11 is formed on the tips of the protrusions 15. FIG. 9 (in particular, FIG. 9D) exemplifies two wiring pattern, i.e. one with singe wiring leading downwards and the other with two wiring (bifurcated) leading downwards. The wiring pattern is not limited to this pattern, and it could be constituted of single wiring pattern only like the second electronic component described in FIG. 6.

Embodiment 4

Embodiment 4 of the present invention will now be described with reference to FIG. 10 to FIG. 13. Only sections which are different from Embodiment 1 to Embodiment 3 will be described. In the drawings, the reference numeral 15 denotes a protrusion, the reference numeral 16 denotes a support, the reference numeral 16*a* denotes a convex form, the reference numeral 17 denotes an insulator (insulation resin), the reference numeral 18 denotes an insulation base material, the reference numeral 18*a* denotes an internal circuit, the reference numeral 19 denotes a resin film, and the reference numeral 20 denotes a wiring pattern groove.

Figure 10:
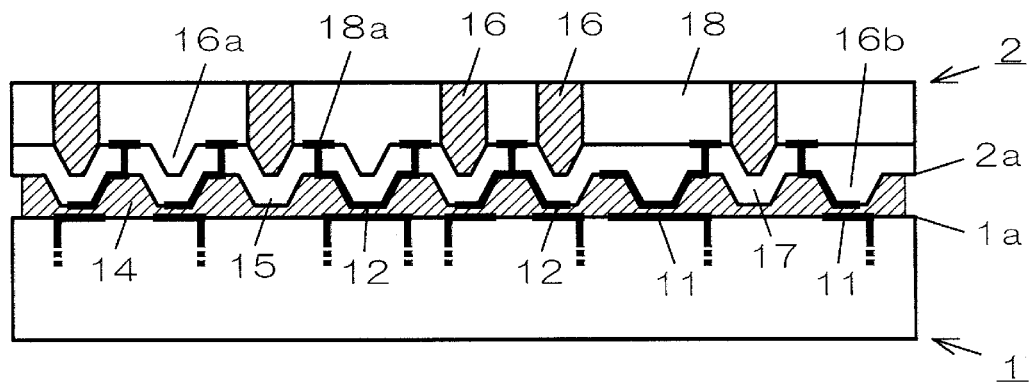
FIG. 10 is a side view depicting a bonding configuration of an electronic component according to Embodiment 4.

As shown in FIG. 10, the protrusions 15 are formed on the surface 2*a* of the second electronic component 2, the wirings 12 are formed on the tips of the protrusions 15, and the wiring 11 of the first electronic component and the wiring 12 of the second electronic component are bonded by the ACP 14 or ACF 14 on the tips of the protrusions 15.

According to this embodiment, the protrusions 15 are: protrusions formed by coating the supports 16 included in the second electronic component 2 with the insulator 17; protrusions formed by coating the convex forms 16*a* on the surface of the second electronic component 2 with the insulator 17; and protrusions that are convex forms 16*b* formed of an insulator 17 on the surface of the second electronic component 2 (a pattern on which two or more types of protrusions 15 coexist). The protrusions 15, however, are not limited to this, and may be: only protrusions formed by coating the supports 16 included in the second electronic component 2 with the insulator 17; only protrusions formed by coating the convex forms 16*a* on the surface of the second electronic component 2 with the insulator 17; or only protrusions that are convex forms 16*b* formed of an insulator 17 on the surface of the second electronic component 2.

In this embodiment, the protrusion 15 have truncated cone shapes. The protrusion 15, however, is not limited to this, but may have a different shape, such as a truncated pyramid, a column, a prism or a semi-sphere.

Figure 11:
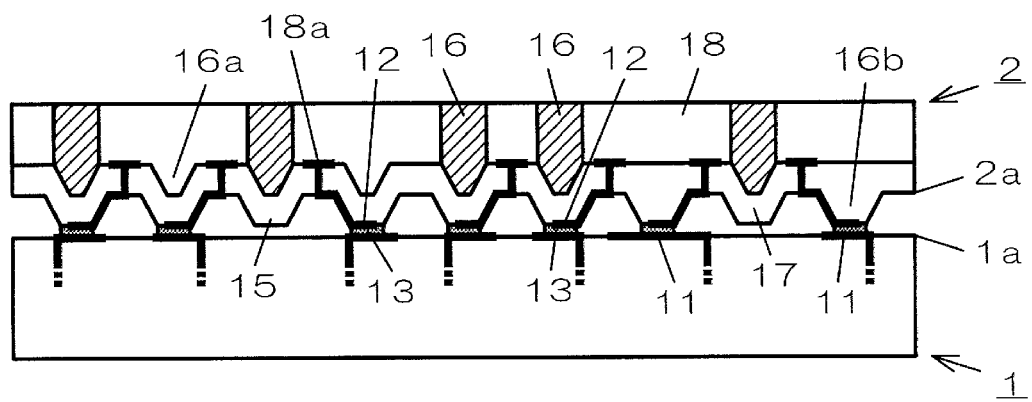
FIG. 11 is a side view depicting another bonding configuration of an electric component according to Embodiment 4.

Another bonding configuration according to this embodiment is that the wiring 11 of the first electronic component and the wiring 12 of the second electronic component are bonded with solder (electric conductor) 13, as shown in FIG. 11. In this case, only the wiring portion is bonded by solder 13, so the advantage is that connection is possible with a small amount of solder. Further, a solder bridge hardly occurs between adjacent solder pieces during soldering for a connection, and a short circuit does not occur very much either. Connection with a narrow pitch is also possible.

Figure 12:
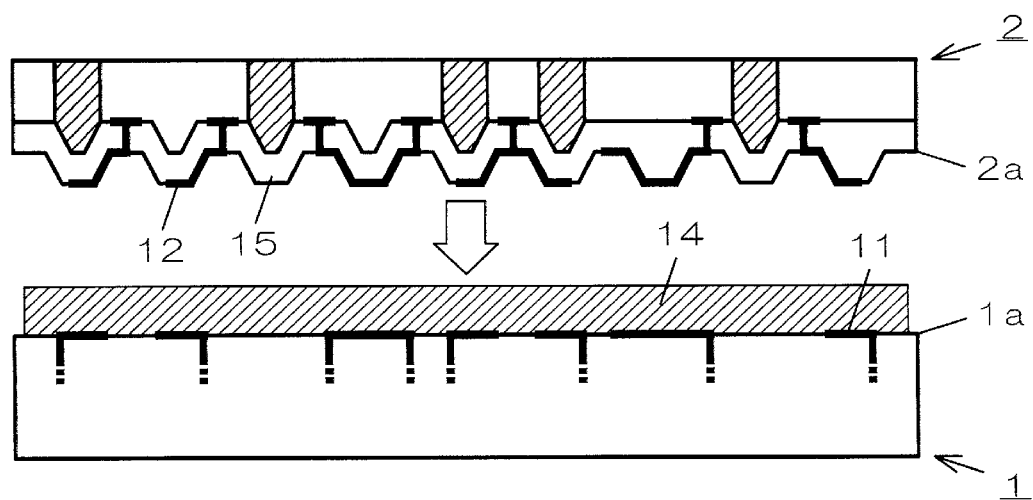
FIG. 12 is a diagram depicting a method for implementing the bonding configuration of the electronic component according to Embodiment 4.

The bonding configuration of the electronic components shown in FIG. 10 can be implemented as follows. As shown in FIG. 12, ACP 14 or ACF 14 is coated or formed on the surface 1*a* of the first electronic component 1. Then the wiring 11 of the first electronic component is coated with the ACP 14 or ACF 14. The surface 1*a* of the first electronic component 1 and the surface 2*a* of the second electronic component 2 are positioned to face each other, and the wiring 11 of the first electronic component and the wiring 12 of the second electronic component are positioned to face each other. In this state, the first electronic component 1 and the second electronic component 2 are thermo-compressed. In this case, the tips of the protrusions 15 of the second electronic component 2 press against the surface 1*a* of the first electronic component 1. The ACP 14 or ACF 14 is filled into the gap between the first and second electronic components 1 and 2, but only the wirings 11 and 12 in the connecting direction (superposing direction) are conducted to each other, and only the superposed wirings 11 and 12 are bonded to each other.

The bonding configuration shown in FIG. 11 is implemented by placing the surface 1*a* of the first electronic component 1 and the surface 2*a* of the second electronic component 2 to face each other, positioning the wiring 11 of the first electronic component and the wiring 12 of the second electronic component to face each other, and bonding the wirings with solder 13 (electric conductor) interposed therebetween, just like Embodiment 1.

Figure 13A:
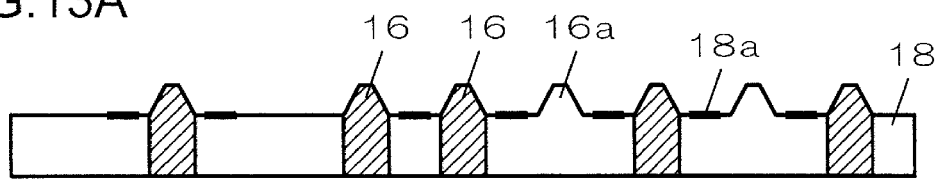
FIGS. 13A through 13E are diagrams depicting a method for acquiring a second electronic component according to Embodiment 4.

The second electronic component 2 can be acquired, for example, as follows. As shown in FIG. 13A, the insulation base material 18 is prepared where the tips of the plurality of supports 16 protrude from the surface, and a plurality of convex forms 16*a* are formed on the surface, and the internal circuit 18*a* is formed on the surface.

Figure 13B:
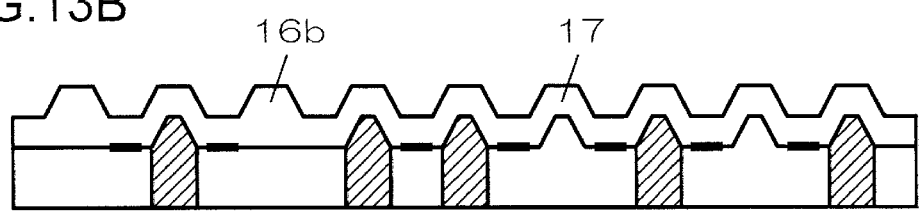

Then as shown in FIG. 13B, the insulator 17 is formed on the surface of the insulation base material 18. The surface of the insulator 17 has concave and convex portions corresponding to the tips of the supports 16 and the convex forms 16*a*. At this time, the convex forms 16*b* are also formed of the insulator 17.

Figure 13C:
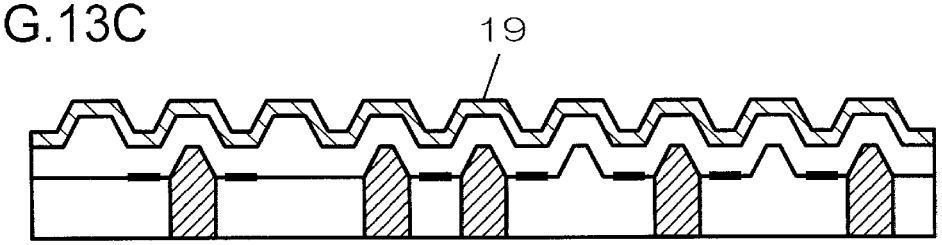

Then as shown in FIG. 13C, the resin film 19 is formed on the surface of the insulator 17. The surface of the resin film 19 has concave and convex portions corresponding to the form of the insulator 17.

Figure 13D:
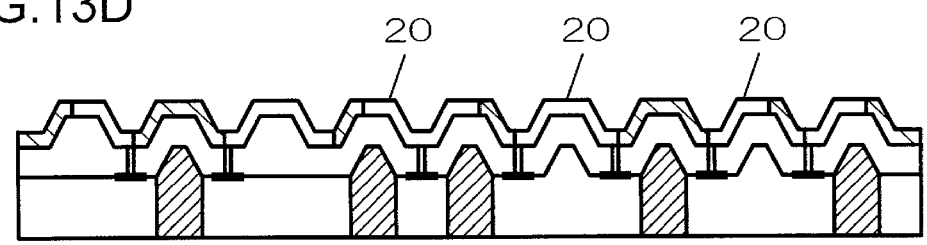

Then as shown in FIG. 13D, a wiring pattern groove 20 having a depth that is the same as or exceeding the thickness of the resin film 19 (in this example a wiring pattern groove having a depth that is the same as the thickness of the resin film 19) is formed from the surface side of the resin film 19. The wiring pattern groove 20 includes continuous holes that lead to the inside of the second electronic component 2. This continuous holes reach the internal circuit 18*a* on the surface of the insulation base material 18. This wiring pattern groove 20 can be formed more accurately if laser processing is performed from the surface side of the resin film 19, for example.

Figure 13E:
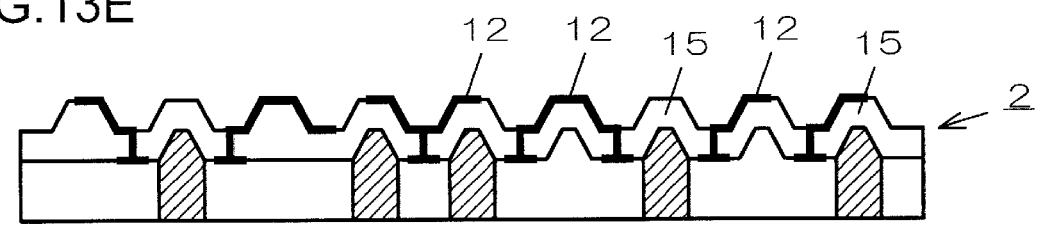

Then plating catalyst or a precursor thereof is coated on the surface of the wiring pattern groove 20. Then the resin film 19 is removed by dissolution or swelling. Then electroless plating is performed so that a plating film is formed only on the portion where the plating catalyst or the plating catalyst formed by the precursor of the plating catalyst remains. The plating film constitutes the wiring 12. Thereby as shown in FIG. 13E, the wiring 12 is formed exactly as the wiring pattern groove 20 on the surface 2*a* of the second electronic component 2. The wiring 12 is connected to the internal circuit 18*a*.

In this embodiment, protrusions 15 are formed on the surface 2*a* of the second electronic component 2, and the wiring 12 is formed on the tips of the protrusions 15, but instead of or in addition to this, protrusions 15 may be formed on the surface 1*a* of the first electronic component 1, and the wiring 11 is formed on the tips of the protrusions 15. FIG. 13 (in particular, FIG. 13E) exemplifies two wiring pattern, i.e. one with singe wiring leading downwards and the other with two wiring (bifurcated) leading downwards. The wiring pattern is not limited to this pattern, and it could be constituted of single wiring pattern only like the second electronic component described in FIG. 11.

Figure 14:
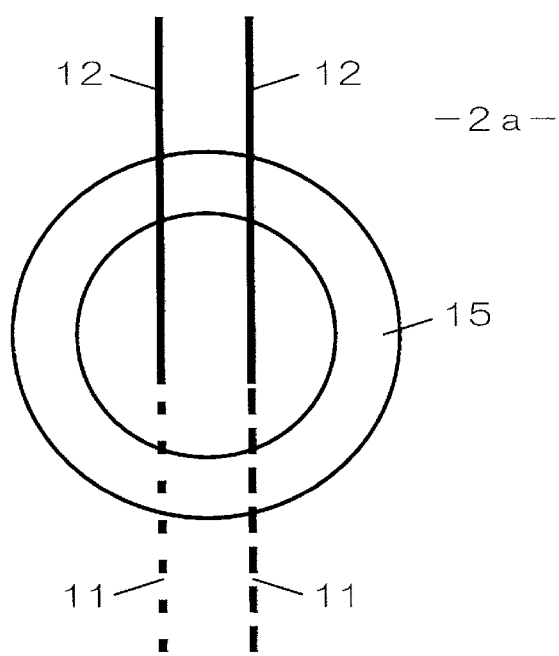
FIG. 14 is a diagram depicting a modification in which a wiring is formed on the tip of the protrusion.

FIG. 14 is a diagram depicting a modification in which the wiring 12 is formed on the tip of the protrusion 15. The solid line indicates the wiring 12 of the second electronic component that passes through the tip of the protrusion 15, and the broken line indicates the wiring 11 of the first electronic component that is bonded with the wiring 12. As illustrated, the number of wirings 12 of the second electronic component that pass through the tip of the protrusion 15 is not limited to 1, but may be 2 or 3 or more. Corresponding to this number, the number of wirings 11 of the first electronic component is not limited to 1 either, but may be 2 or 3 or more.

Figure 15:
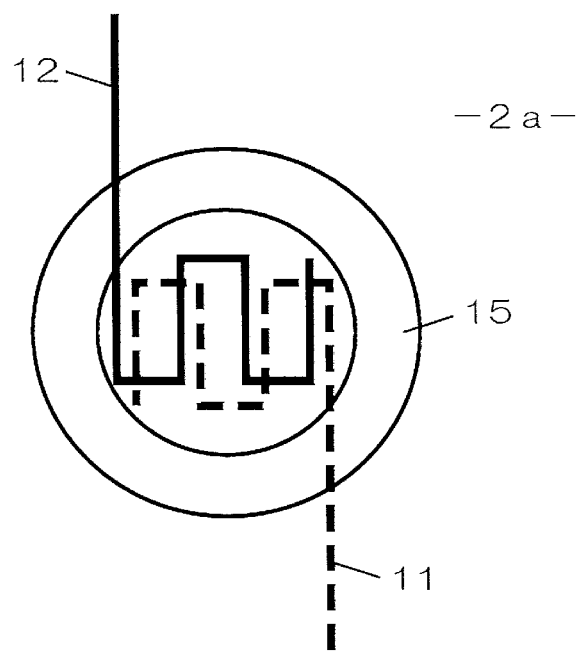
FIG. 15 is a diagram depicting a failsafe function to prevent wiring misalignment.
Figure 16:
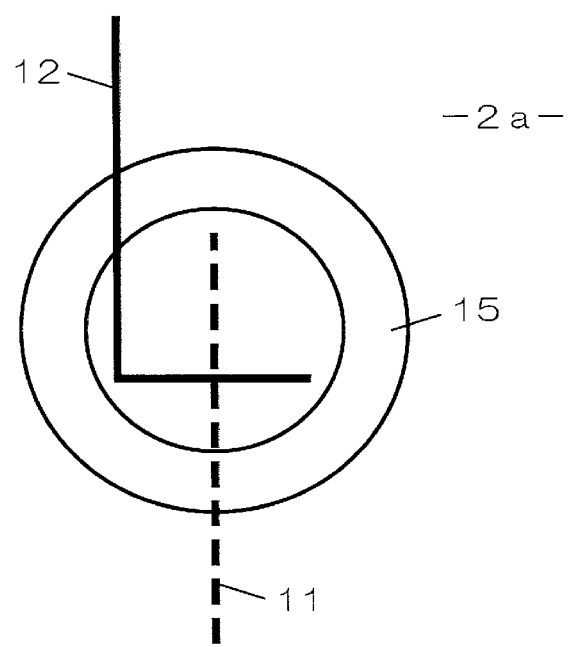
FIG. 16 is a diagram depicting another failsafe function to prevent wiring misalignment.

FIG. 15 and FIG. 16 are diagrams depicting a failsafe functions to prevent wiring misalignment. The solid line indicates the wiring 12 of the second electronic component that passes through the tip of the protrusion 15, and the broken line indicates the wiring 11 of the first electronic component that is bonded with the wiring 12. As mentioned above, the wiring 11 of the first electronic component and the wiring 12 of the second electronic component may mutually extend in the same direction, and may be bonded for a relatively long distance, or may extend in mutually different directions and be bonded for a relatively short distance. In the case of the former, if a major misalignment occurs between the wirings 11 and 12, overlapping of the wirings 11 and 12 becomes insufficient, and a bonding failure occurs. Therefore it is preferable to ensure overlapping of the wirings 11 and 12 by winding the wirings 11 and 12 as shown in FIG. 15, or by bending one of the wirings as shown in FIG. 16.

Figure 17:
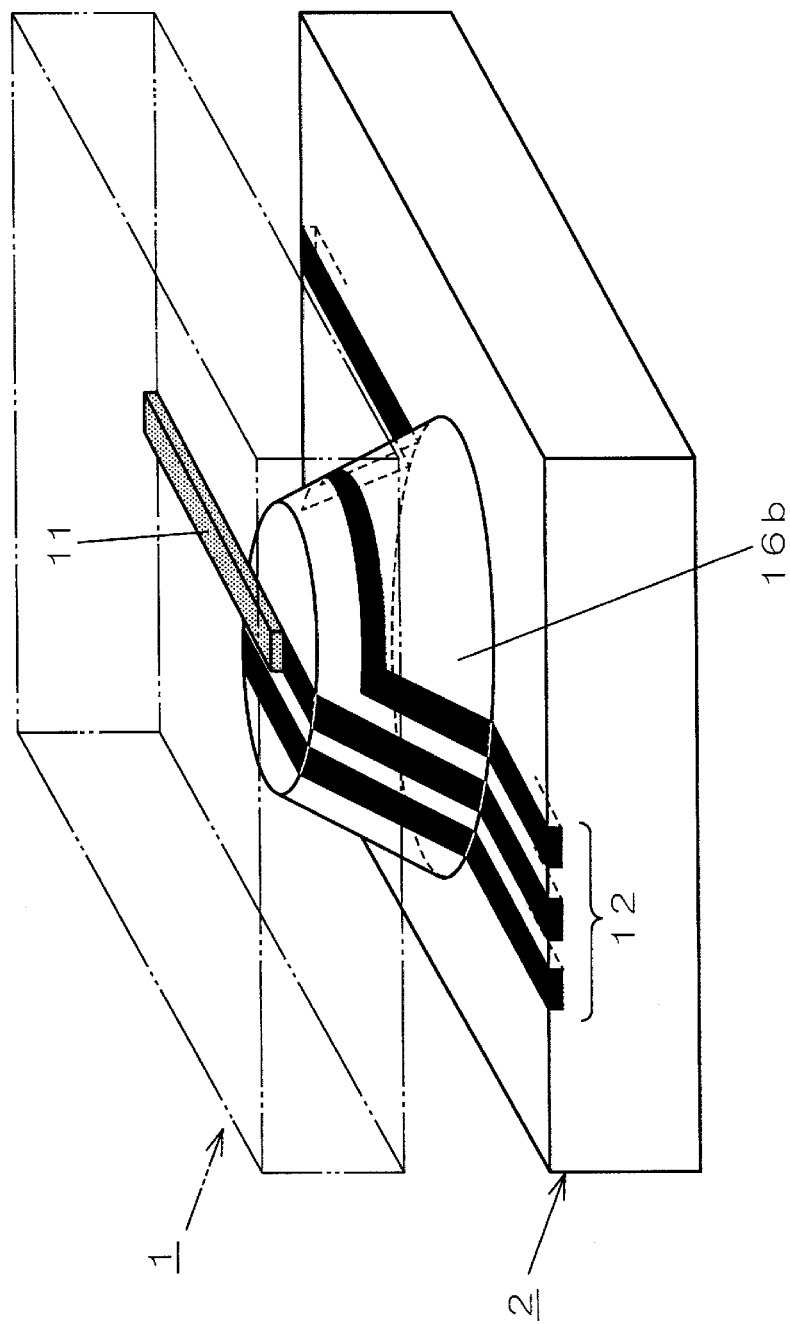
FIG. 17 is a diagram depicting an embodiment where a plurality of wirings are formed in one convex form.

Further, according to this embodiment, the surface of the convex form 16b is formed of the insulator 17, as shown in FIG. 17, therefore the wirings for routing other than the wirings to be bonded, which are not used for bonding, can be freely formed on the protrusion or the inclined surface of the protrusion. In other words, this embodiment includes an assembly of electronic components where a plurality of wirings are formed for one protrusion formed on the surface of the electronic component, and an assembly of electronic components where a wiring is also formed on an inclined surface of the protrusion.

By this configuration, the number of wirings routed between protrusions can be decreased. Another advantage is that the wirings can be formed at high density, and that the length of the wirings can be decreased.

The wiring 11 of the first electronic component 1 and the wiring 12 of the second electronic component 2 are both described as trench wirings which are buried in components in FIG. 17. However, the wiring 12 of the second electronic component 2 should not be limited to trench wiring and a conventional wiring could be also used as the wiring 12.

Figure 18:
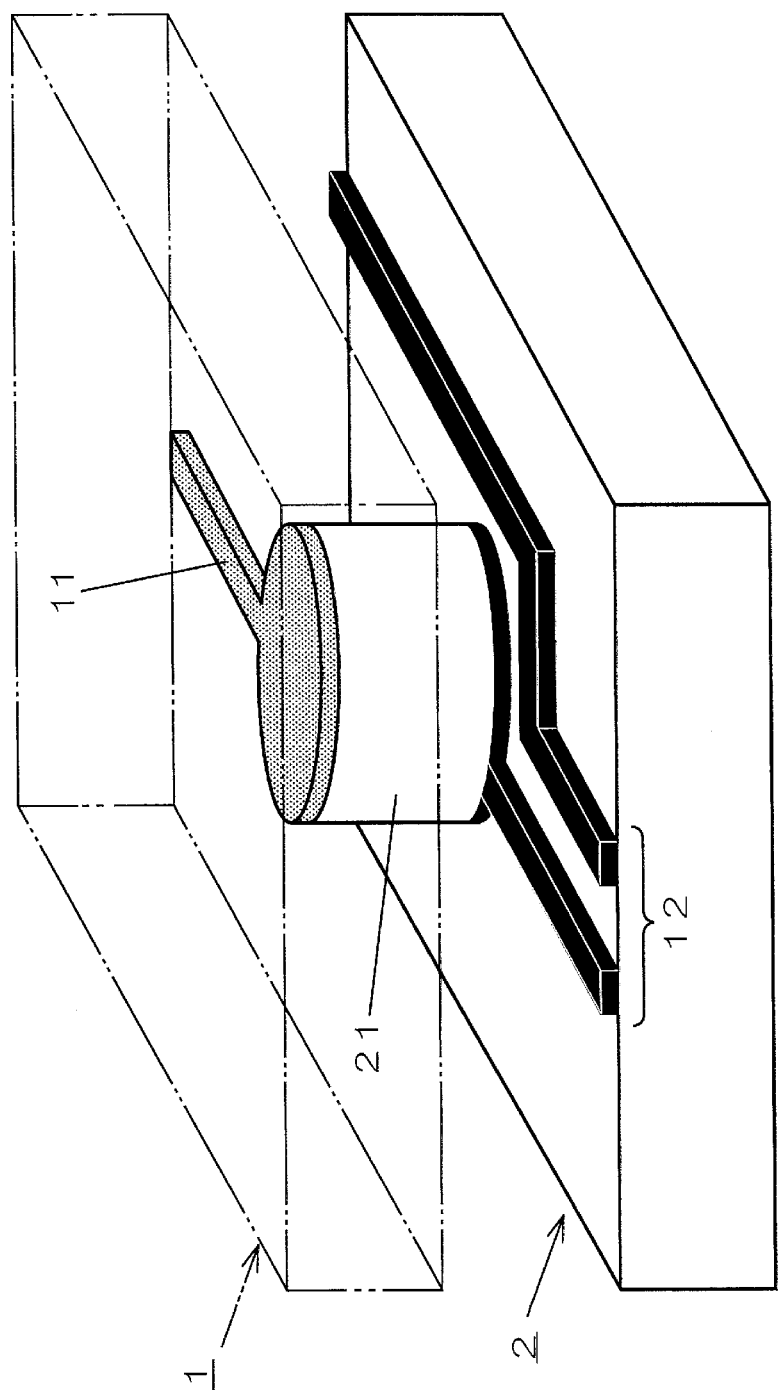
FIG. 18 is a diagram depicting a mode of connection using a conventional conductor bump.

Whereas in the case of an assembly of electronic components using conventional conductor bumps 21 as shown in FIG. 18, the above mentioned advantage cannot be acquired since the wiring for routing, that is not used for bonding, must be routed to avoid the conductor bumps 21.

Embodiment 5

Embodiment 5 of the present invention will now be described with reference to FIG. 19. Only sections which are different from Embodiment 1 to Embodiment 4 will be described.

Figure 19:
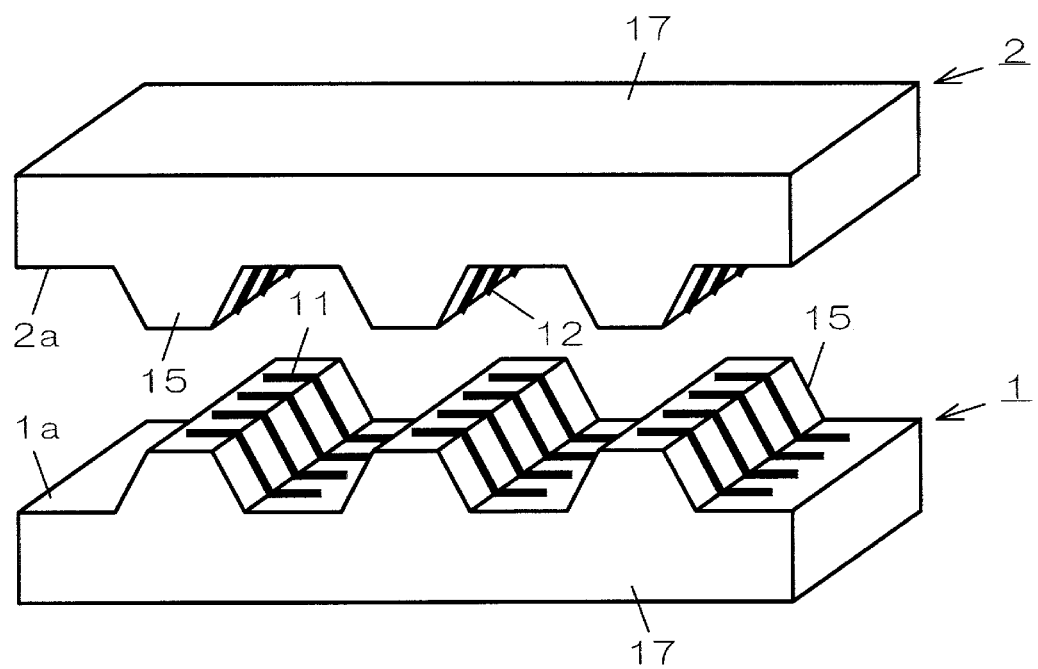
FIG. 19 is a perspective view depicting a bonding configuration of an electronic component according to Embodiment 5.

As shown in FIG. 19, according to this embodiment, protrusions 15 are formed on the surface 2a of the second electronic component 2, and a wiring 12 is formed on the tip of the protrusion 15, and protrusions 15 are also formed on the surface 1a of the first electronic component 1, and a wiring 11 is formed on the tip of the protrusion 15, and the wiring 11 of the first electronic component and the wiring 12 of the second electronic component are bonded to each other at the tip of the protrusion 15 of the second electronic component 2 and the protrusion 15 of the first electronic component 1.

According to this embodiment, all the protrusions 15 are formed by the insulators 17 which form the surface 1a of the first electronic component 1a or the surface 2a of the second electronic component 2. In this embodiment, the protrusion 15 has a protruding form with a predetermined length.

As shown in FIG. 19, a plurality of wirings 11 are formed on the tips of the protrusions 15 of the first electronic component 1. A plurality of wirings 12 are also formed on the tips of the protrusions 15 of the second electronic component 2 at positions corresponding to the wirings 11. The wirings 11 and the corresponding wirings 12 are superposed and bonded to each other.

Figure 20:
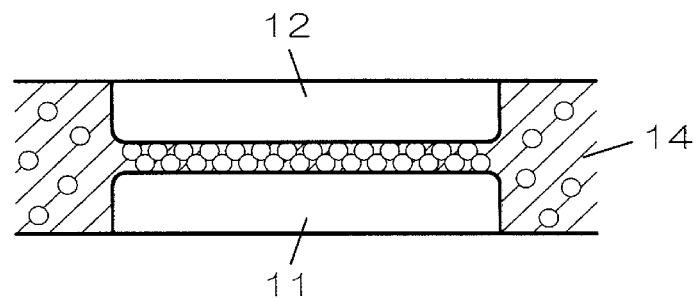
FIG. 20 is a diagram depicting an example when a wiring is not buried in the surface of the electronic component (convex circuit).
Figure 21:
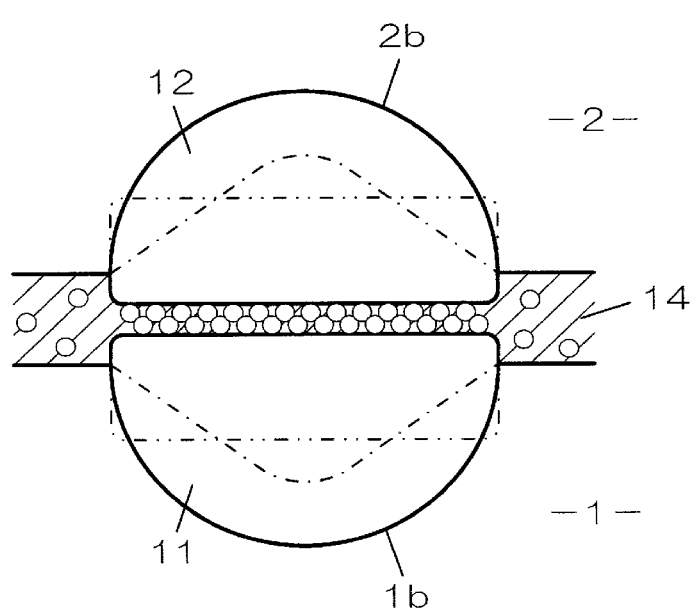
FIG. 21 is a diagram depicting an example when a part of a wiring is buried in the surface of the electronic component (groove circuit).

The wirings 11 and 12 may not be buried in the surface 1a or 2a of the electronic component 1 or 2 (convex circuit) as shown in FIG. 20, or a part or all of the wirings 11 or 12 may be buried in a surface 1a or 2a of the electronic components 1 or 2 (groove circuit) (in the drawings a part of the wirings 11 and 12 is buried), as shown in FIG. 21.

The wirings 11 and 12 that are not buried in the surface 1a or 2a of the electronic component 1 or 2 can be acquired by forming a wiring pattern groove 20 having a depth that is the same as the thickness of the resin film 19 from the surface side of the resin film 19, as shown in FIG. 13D, for example. The wirings 11 and 12 that are buried in the surface 1a or 2a of the electronic component 1 or 2, on the other hand, can be acquired by forming a wiring pattern groove 20 having a depth exceeding the thickness of the resin film 19 from the surface side of the resin film 19, as shown in FIG. 13D, for example. In the latter case, concave grooves 1b and 2b are formed on the surface of the insulators 17 constituting the surfaces 1a and 2a of the electronic components 1 and 2, and plating films constituting the wirings 11 and 12 enter the concave grooves 1b and 2b.

In FIG. 21, the concave grooves 1b or 2b, of which cross-sectional shape is semi-circular, is illustrated, but the cross-sectional shape of the concave groove is not limited to this, and may be a different shape, such as triangular or rectangular (see the dashed line in FIG. 21).

In FIG. 20 and FIG. 21, ACP 14 or ACF 14 is used as the electric conductor, but even in the case of bonding using solder 13, as in FIG. 22 to FIG. 25, the wirings 11 and 12 can be convex circuits or groove circuits, and can be carried out in various modes. Some of the modes and advantages thereof will now be described with reference to FIG. 22 to FIG. 25.

Figure 22:
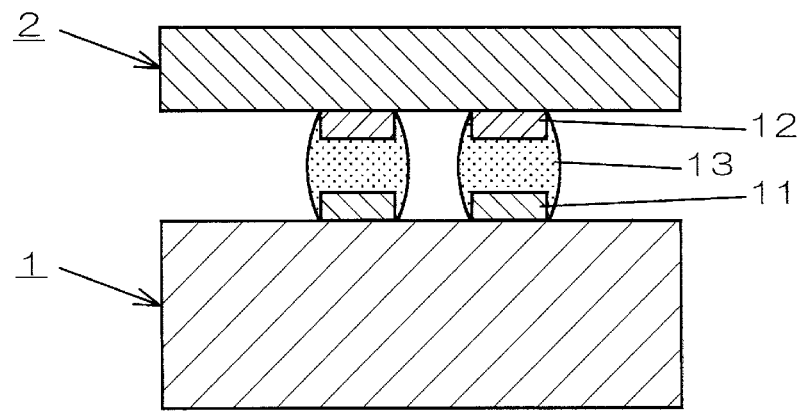
FIG. 22 is a diagram depicting an example of using solder for a convex circuit.

In the case of a convex circuit (bonding the wirings 11 and 12, which are not buried in the surfaces 1a and 2a of the electronic components 1 and 2, with solder 13), the wirings are convex as shown in FIG. 22, therefore the solder 13 may spread onto the side faces of the convex wirings, which makes the width of the solder wider than the wiring width. In this case, the solder 13 spreads onto the side faces of the convex wiring, and a part of the wiring at the connection portion is buried by solder, which means that the contact surfaces between the connection solder and the wiring increases, the connection strength increases, and this is advantageous in terms of the reinforcement effect.

Figure 23:
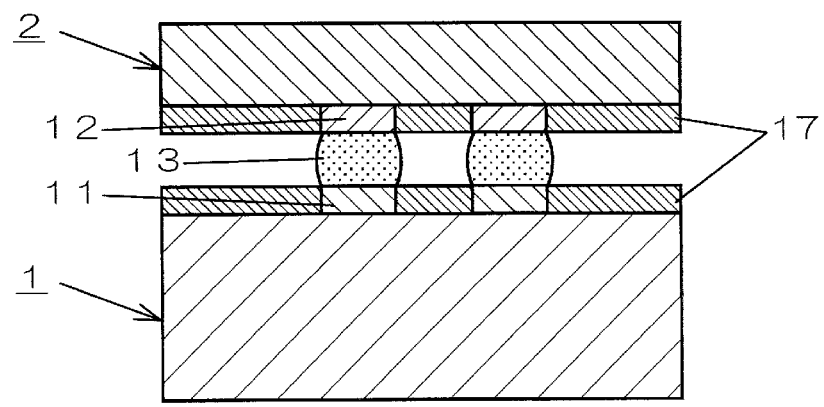
FIG. 23 is a diagram depicting another example of using solder for a convex circuit.

Another embodiment of the convex circuit is forming resist (insulation base material) 17 around the wirings 11 and 12 as shown in FIG. 23. In this case, the wirings at the connection portions are partially covered with the resist (insulation base material) 17, so the solder does not spread onto the side faces of the wiring convex portion, and adjacent solder bonding portions can be disposed at a narrow pitch, which is an advantage. As resist (insulation base material) 17, for example, permanent resist and/or solder resist can be used. In FIG. 23, the resist (insulation base material) 17 covers around the wirings 11 and 12 with no space between them, however, there could be some space between the resist (insulation base material) 17 and the wirings 11 and 12. Further, the resist (insulation base material) 17 may cover the wirings 11 and 12 partially, for example, such that the resist (insulation base material) 17 covers the whole surface of circuit except the connection portion which is left open.

Figure 24:
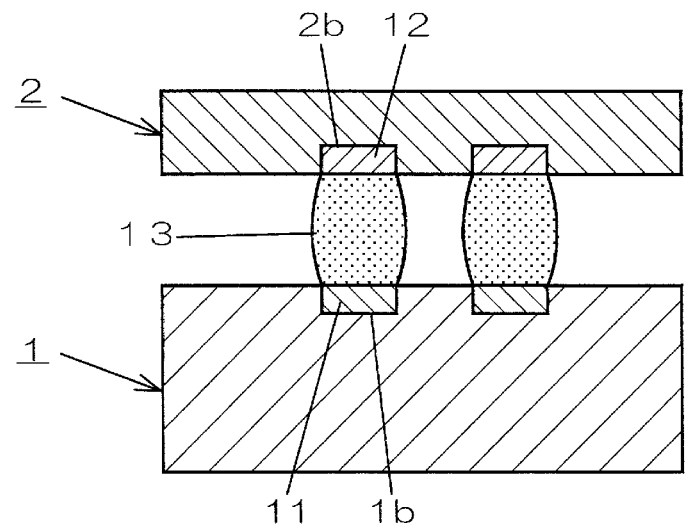
FIG. 24 is a diagram depicting an example of using solder for a groove circuit.

In the case of a groove circuit (bonding the wirings 11 and 12, which are partially or totally buried in the surfaces 1a and 2a of the electronic components 1 and 2 with solder 13), plating is filled into the concave grooves 1b and 2b formed on the surfaces 1a and 2a of the electronic components 1 and 2 as shown in FIG. 24. If the wirings 11 and 12 are buried like this, the solder 13 does not spread onto the side faces of the circuit, unlike the case of the convex circuit described above, therefore a solder bridge does not occur very much at a solder pitch or connection pitch, which is particularly advantageous in terms of decreasing pitch.

Figure 25:
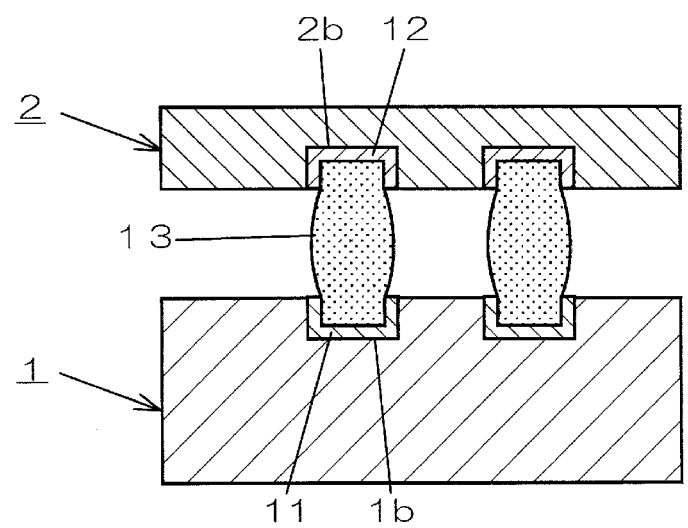
FIG. 25 is a diagram depicting an example of using solder for a groove circuit, and having a concave portion in the groove.

Further, the groove circuit may have concave portions in the concave grooves 1b and 2b as shown in FIG. 25, and in this case, the reinforcement effect can be added since solder 13 enters into the concave portions.

In the case of the groove circuits shown in FIG. 24 and FIG. 25, the concave groove 1b or 2b, of which cross-sectional shape is rectangular, is illustrated, but the cross-sectional shape of the groove circuit is not limited to this, and may be a different shape, such as semicircular or triangular.

As described above, in the assembly of electronic components 1 and 2 according to this embodiment, the wiring 11 formed on the surface 1a of the first electronic component and the wiring 12 formed on the surface 2a of the second electronic component 2 face each other, and are bonded with the electric conductor 13 or 14 interposed therebetween, so as to electrically connect the first electronic component 1 and the second electronic component 2.

Thereby when the first electronic component 1 and the second electronic component 2 are electrically connected, the wirings 11 and 12 having the same sizes can be bonded without a pad or a land having different sizes interposed therebetween, therefore mismatch of impedance in the connecting portion can be decreased.

Further, the solder 13 or the conductive filler 14a as the electric conductor are approximately contained in the width of the wirings 11 and 12, hence mismatch of impedance in the connection portion can be decreased even if the electric conductor 13 or 14 is included.

Further, both the electrical connection and the mechanical bonding of the first electronic component 1 and the second electronic component 2 are implemented by using the resin composition 14b (ACP 14 or ACF 14) containing the solder 13 or conductive filler 14a as the electric conductor.

In the assembly of the electronic components 1 and 2 according to this embodiment, protrusions 15 are formed on the surface 1a of the first electronic component 1 and/or the surface 2a of the second electronic component 2, a wiring 11 or 12 is formed on the tip of the protrusion 15, and the wiring 11 of the first electronic component and the wiring 12 of the second electronic component are bonded to each other at the tip of the protrusion 15.

Thereby when the first electronic component 1 and the second electronic component 2 are thermo-compressed, the tip of the protrusion 15 of one electronic component presses against the surface of the other electronic component, or the tips of the protrusions 15 of both electronic components press against each other. Therefore the pressing force concentrates on the connection portion, and promotes bonding of the wiring 11 of the first electronic component and the wiring 12 of the second electronic component.

In this case, the protrusions 15 are: protrusions formed by molding the surface 1a of the first electronic component 1 or the surface 2a of the second electronic component 2 into convex forms; protrusions formed by coating the supports 16 included in the first electronic component 1 or the second electronic component 2 with an insulator 17; protrusions formed by coating the convex forms 16a on the surface of the first electronic component 1 or the surface of the second electronic component 2 with an insulator 17; and/or protrusions that are convex forms 16b formed of an insulator 17 on the surface of the first electronic component 1 or the surface of the second electronic component 2. The protrusion 15 may be totally formed of the insulator 17 constituting the surfaces 1a or 2a of the electronic component 1 or 2. One or any two or more types of protrusions 15 mentioned above may coexist. The forming pattern of the protrusion 15 can be selected from these types depending on whether the electronic component 1 or 2 is a semiconductor chip, a substrate, a package or a circuit board, for example.

It is preferable that the wiring 11 or 12 is partially or totally buried in the surface 1a or 2a of the electronic component 1 or 2. This is because misalignment of or missing of the wirings 11 and 12 can be controlled.

If a failsafe function to prevent misalignment of wirings is included, overlapping of the wirings 11 and 12 can be ensured, even if misalignment occurs between the wirings 11 and 12, and bonding failure can be prevented.

The invention claimed is:

1. An assembly of electronic components in which electronic components are electrically connected to each other, wherein
    a wiring electrically connecting a first electronic component and a wiring electrically connecting a second electronic component face each other, and are bonded to each other with an electric conductor interposed therebetween, so as to electrically connect the first electronic component and the second electronic component, and
    wherein at least one of the wiring of the first electronic component or the wiring of the second electronic component is composed of two parts, one part of the wiring is on a surface of and one part of the wiring is partially or totally buried in the first or second electronic component.

2. The assembly of electronic components according to claim 1, wherein
    the electric conductor is a resin composition containing a solder or a conductive filler.

3. The assembly of electronic components according to claim 1, wherein
    protrusions are formed on at least one of the surface of the first electronic component or the surface of the second electronic component, the wiring is formed on a tip of the protrusion, and the wiring of the first electronic component and the wiring of the second electronic component are bonded to each other at the tip of the protrusion.

4. The assembly of electronic components according to claim 3, wherein the protrusions are at least one selected from: protrusions formed by molding the surface of the first electronic component or the surface of the second electronic component into convex forms; protrusions formed by coating supports included in the first electronic component or the second electronic component with an insulator; protrusions formed by coating convex forms on the surface of the first electronic component or the surface of the second electronic component with an insulator; protrusions that are convex forms formed of an insulator on the surface of the first electronic component or the surface of the second electronic component or combinations thereof.

5. The assembly of electronic components according to claim 1, wherein the width of electric conductor is 150% or less if the width of the wiring is 100%.

6. The assembly of electronic components according to claim 2, wherein
protrusions are formed on the surface of the first electronic component or on the surface of the second electronic component or both, the wiring is formed on a tip of the protrusion, and the wiring of the first electronic component and the wiring of the second electronic component are bonded to each other at the tip of the protrusion.

7. A method of connecting electronic components for electrically connecting electronic components to each other, wherein
a wiring electrically connecting a first electronic component and a wiring electrically connecting a second electronic component face each other, and are bonded to each other with an electric conductor interposed therebetween, so as to electrically connect the first electronic component and the second electronic component, and
wherein at least one of the wiring of the first electronic component or the wiring of the second electronic component is composed of two parts, one part of the wiring is on a surface of and one part of the wiring is partially or totally buried in the first or second electronic component.

* * * * *